(12) United States Patent
Ruby et al.

(10) Patent No.: US 6,228,675 B1
(45) Date of Patent: May 8, 2001

(54) MICROCAP WAFER-LEVEL PACKAGE WITH VIAS

(75) Inventors: Richard C. Ruby, Menlo Park; Tracy E. Bell, Campbell; Frank S. Geefay, Cupertino; Yogesh M. Desai, San Jose, all of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/360,859

(22) Filed: Jul. 23, 1999

(51) Int. Cl.[7] .................................................. H01L 21/44
(52) U.S. Cl. ............................................. 438/106; 257/678
(58) Field of Search .................................. 438/106, 112, 438/123, 124, 456–459, 612–616; 257/678, 704, 710, 774

(56) References Cited

U.S. PATENT DOCUMENTS 5,448,014 * 9/1995 Kong et al. ......................... 174/52.3

* cited by examiner

Primary Examiner—David Nelms
Assistant Examiner—Quoc Hoang (57) ABSTRACT

A microcap wafer-level package is provided in which a micro device is connected to bonding pads on a base wafer. A peripheral pad on the base wafer encompasses the bonding pads and the micro device. A cap wafer is processed to form wells of a predetermined depth in the cap wafer. A conductive material is made integral with the walls of the wells in the cap wafer. The cap wafer has contacts and a peripheral gasket formed thereon where the contacts are capable of being aligned with the bonding pads on the base wafer, and the gasket matches the peripheral pad on the base wafer. The cap wafer is then placed over the base wafer so as to bond the contact and gasket to the pads and form a hermetically sealed volume within the peripheral gasket. The cap wafer is thinned to form a "microcap". The microcap is thinned below the predetermined depth until the semiconductor dopant is exposed to become conductive vias through the cap wafer to outside the hermetically sealed volume.

20 Claims, 5 Drawing Sheets

MICROCAP WAFER-LEVEL PACKAGE WITH VIAS

CROSS-REFERENCE TO RELATED APPLICATIONS

The present application contains subject matter related to a concurrently filed U.S. Patent Application by Richard C. Ruby, Tracy E. Bell, Frank S. Geefay, and Yogesh M. Desai entitled "MICROCAP WAFER-LEVEL PACKAGE". This application is being filed contemporaneously herewith, is identified by docket number 10990686-1, and is hereby incorporated by reference.

1. Technical Field

The present invention relates to wafer-level packaging techniques, and more specifically to wafer-level, chip-scale packaging of micro devices.

2. Background Art

In the past, a number of wafer-to-wafer bonding techniques have been developed for packaging micro devices. The techniques have included silicon-to-glass anodic bonding, silicon to silicon fusion bonding, and wafer to wafer bonding using various intermediate materials as the actual bonding media. The connection to a hermetically sealed micro device was generally made either under the bonding media against one of the wafers or through the wafer with grommet-type seals around wire conductors.

In both situations, irregularities would occur around the connection such that a reliable hermetic seal of the wafer package could not be assured.

A relatively simple process that would provide a non-electrical, low temperature method for hermetically packaging micro devices has long been sought. Ideally, all seals would be formed by bonding planar surfaces to planar surfaces with no seals that are penetrated by wire conductors. Also, the ideal included processes that would use standard, or close to standard, procedures available in a chemical semiconductor laboratory or manufacturing facility.

One example of such packaging method is shown in U.S. Pat. No. 5,448,014 to Kong et al. However, Kong et al. requires multi-layer standoffs to adjust the distance between the two wafers. Additionally, the disclosed use of different materials for each of the wafers can cause potentially adverse consequences due to the different thermal coefficients of expansion of the materials when the package is manufactured using heat as disclosed. Further, Kong et al uses metallic conductive vias incorporating gallium and/or mercury, which require barriers to diffusion.

In the past, making electrical contact to the packaged devices was difficult because existing methods did not provide a wafer-to-wafer seal that allowed the electrical conductor to pass through the wafer package itself without the use of grommets or sealing rings in the holes around the wires. The previous sealing rings, besides being very small and difficult to handle, were subject to leaking because of the flexing of the wire conductors in the seal that would open the seal.

Further, with the miniaturization of micro device utilizing systems, small wafer-level packages have become highly desirable. This has meant that ultra-thin, or microcap wafer packages with through contacts, have become the goal for the micro device industry.

Thus, the ability to connect to the micro device inside of a wafer-level package has been a significant problem for many years.

DISCLOSURE OF THE INVENTION

The present invention provides a microcap wafer-level package in which a micro device is connected to bonding pads on a base wafer. A peripheral pad on the base wafer encompasses the bonding pads and the micro device. A cap wafer is processed to form wells of a predetermined depth in the cap wafer. A conductive material is made integral with the walls of the wells in the cap wafer. The cap wafer has contacts and a peripheral gasket formed thereon where the contacts are capable of being aligned with the bonding pads on the base wafer, and the gasket matches the peripheral pad on the base wafer. The cap wafer is then placed over the base wafer so as to bond the contact and gasket to the pads and form a hermetically sealed volume within the peripheral gasket. The cap wafer is thinned to form a "microcap". Essentially, the microcap is thinned below the predetermined depth until the conductive material is exposed to form conductive vias through the cap wafer to outside the hermetically sealed volume. This via arrangement assures a reliable, high conductivity, hermetically sealed connection into the wafer-level package. Further, this process permits the wafers to be made thinner than previously practical because it forms the microcap in situ and avoids the handling of the fragile microcap during assembly.

The present invention provides a microcap wafer-level package in which a cap wafer is processed to form wells of a predetermined depth in the cap wafer. A semiconductor dopant is deposited in the wells by gas-source, liquid-source, or solid-source diffusion followed by a layer of semiconductor material. The cap wafer is annealed to diffuse the semiconductor dopant into the walls of the wells and into the layer of semiconductor material. This via arrangement assures a reliable, high conductivity, hermetically-sealed connection into the wafer-level package.

The present invention provides a microcap wafer-level package in which a cap wafer is processed to form an array of closely spaced wells of a predetermined depth in the cap wafer. The wells are filled with or become a conductive semiconductor material. A manufacturing process is then used to thin the cap wafer below the predetermined depth until the wells become conductive vias through the cap wafer. Outside bonding pads are formed on the cap wafer over the array of vias in the configuration of the array in order to reduce the overall resistivity of the contacts and tailor the configuration thereof.

The present invention provides an electrical or mechanical micro device in a wafer-level, chip-scale package that hermetically seals the micro device while providing electrical connection through one of the wafers.

The present invention further provides a device in a wafer-level, chip-scale package that allows an electrical connection to the micro device to be made through the wafer sealing the package itself.

The present invention further provides a wafer-level, chip-scale packaging technique utilizing a low-temperature batch process done at the wafer level which results in a hermetic seal and allows electrical contacts to be made to standard bonding pads on top of a cap wafer.

The present invention further provides a relatively simple process that results in a hermetic seal for micro devices which does not require high voltages or temperatures.

The present invention further provides a method of manufacturing a wafer package utilizing process steps and equipment that are standard or close to standard to the processes and equipment used in a typical semiconductor laboratory or manufacturing facility.

The present invention further provides a method of manufacturing a wafer-level package in which a micro device, such as an integrated circuit, can be in one or both wafers.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
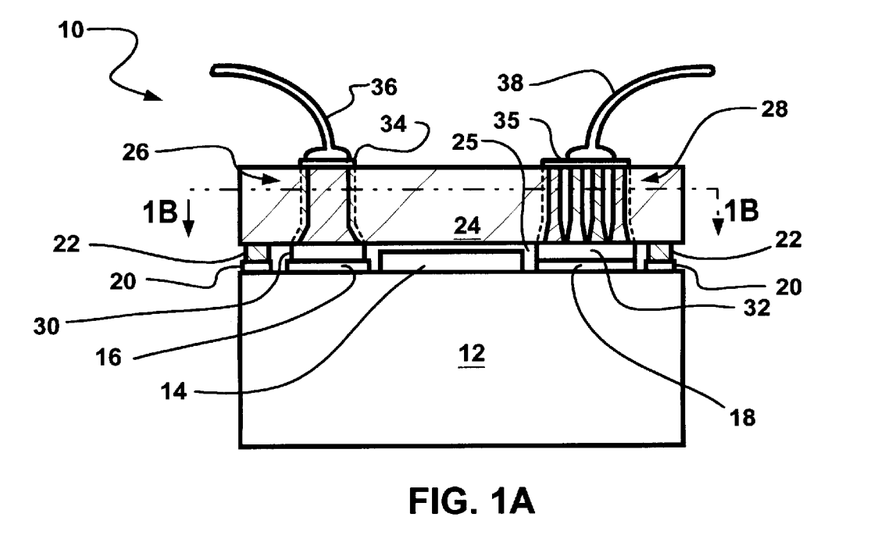
FIG. 1A shows a cross-section of the microcap wafer-level package of the present invention with different semiconductor vias.

Referring now to FIG. 1A, therein is shown a cross section of a microcap wafer-level package 10 having a base wafer 12. The base wafer 12 has an associated micro device 14, such as an active device like an integrated circuit or a passive device like a sensor. The micro device 14 is electrically connected to bonding pads 16 and 18 by conductive leads (not shown) also associated with the base wafer 12. Around the perimeter of the base wafer 12 is a peripheral pad 20 which may be deposited at the same time as the bonding pads 16 and 18, and may be of the same thickness.

A peripheral pad seal, or gasket 22, extends between a cap wafer 24 and the peripheral pad 20 on the base wafer 12 and is cold weld bonded to the peripheral pad 20 to provide a hermetically-sealed volume 25 around the micro device 14. The cap wafer 24 can be made of an electronically non-conductive material or a high-resistivity semiconductor material, such as single crystal silicon. Preferably, however, both the base wafer 12 and the cap wafer 24 are made of the same material to avoid thermal expansion mismatch problems.

The cap wafer 24 has conductive vias 26 and 28 provided therein. The conductive via 26 is a single conductive via and the conductive via 28 is an array of smaller conductive vias. In FIG. 1A, the conductive vias 28 are four in number, but it would be understood that the number could be more or less depending on the conductivity desired for the conductive via 28. Contacts 30 and 32 are respectively formed on the conductive vias 26 and 28 at the same time the gasket 22 is formed. The contacts 30 and 32 are cold weld bonded to the respective bonding pads 16 and 18 to make the electrical connections to the micro device 14. With the present invention, electrical connections (not shown) between the micro device 14 and its bonding pads, such as the bonding pads 16 and 18, are located in the hermetically-sealed volume 25 and do not pass through the gasket 22.

The cap wafer 24 is further provided with outside bonding pads 34 and 35 having conductors, or bonding wires 36 and 38, respectively, bonded thereto for connecting the microcap wafer-level package 10 and the micro device 14 to a micro device-utilizing system (not shown).

The bonding pads 16 and 18, the peripheral pad 20, and the contacts 30 and 32, in the embodiment shown are of gold; however, other materials can be used without departing from the scope of the present invention. For example, other materials capable of being bonded to each other can be used, such as silicon, indium, aluminum, copper, silver, alloys thereof, and compounds thereof.

Figure 1B:
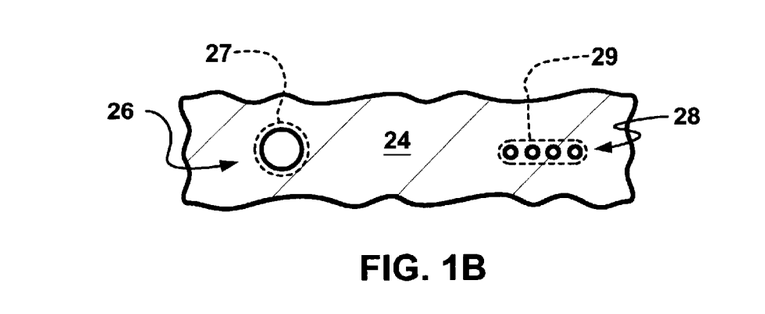
FIG. 1B shows a cross-section of the microcap wafer-level package along line 1 B—1B of FIG. 1A.

Referring now to FIG. 1B, therein is shown a cross-section of the microcap wafer-level package 10 along line 1B—1B of FIG. 1A. The conductive vias 28 are shown as a linear array of four conductive vias, but it would be understood that each of the individual conductive vias could be placed in any geometrical configuration. A diffused semiconductor dopant 27 is shown as part of the conductive via 26 and a diffused semiconductor dopant 29 is shown as part of the plurality of conductive vias which make up the conductive via 28. The preferred semiconductor dopants 27 and 29 are Group III and Group V elements, such as phosphorus or boron, but other dopants are well known to those skilled in the art.

While shapes are not shown, it would be understood that the contact 30 and the outside bonding pad 34 would be configured to match the pattern of the semiconductor dopant 27 as much as possible to maximize conductive contact. Similarly, the contact 32 and the outside bonding pad 35 could be generally configured to match the pattern of the conductive via 26. For the linear array of conductive via 28, the configuration would be an elongated rectangle.

Referring now to FIGS. 2A through 2H, therein are shown the process steps for fabricating the microcap wafer-level package 10 shown in FIG. 1A and FIG. 1B. Hereinafter, all components, which are the same in the various figures, will use the same description and number notations.

Figure 2A:
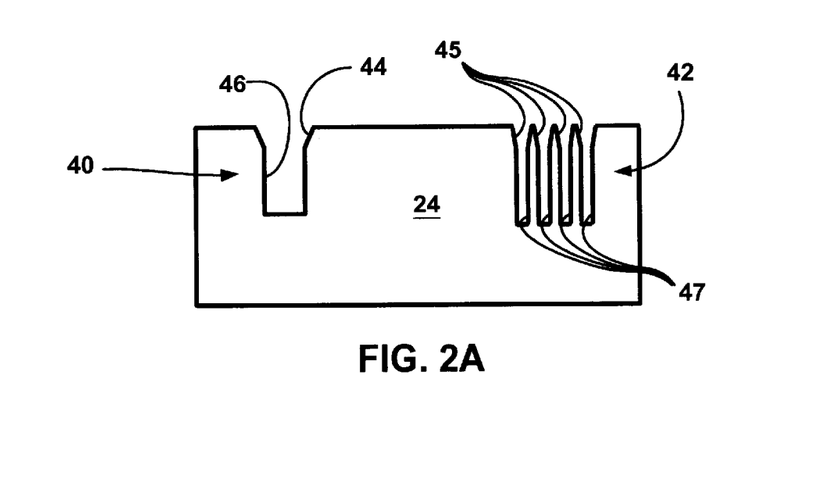
FIGS. 2A through 2H show the process steps for fabricating the microcap wafer-level package of the present invention.

FIG. 2A shows the cap wafer 24 with wells 40 and 42 formed having respective entry tapers 44 and 45 which are a part of respective walls 46 and 47. The wells 40 and 42 are formed using conventional photolithographic and etching processes. The entry tapers 44 and 45 help prevent the top of the wells 40 and 42 from filling and closing first. The wells 42 are shown as a linear array of four small diameter wells.

Preferably, the wells 40 and 42 are formed in a two-step process comprising a first short duration wet etch to create entry tapers 44 and 45 followed by a dry etch process to form the wells 40 and 42. For illustrative purposes only, the cap wafer 24 has an initial thickness in excess of 200 microns. The cap wafer 24 is then etched to form a well 40 that, for illustrative purposes, are approximately 1 to 50 microns in diameter and over 100 microns deep. The wells 42, for illustrative purposes, are approximately 1 to 10 microns in diameter and also over 100 microns deep.

Conventional etching processes may be used, such as a dry etch process. One such dry etch process is a plasma-etch process used to etch high-aspect ratio channels and vias in deep silicon etching. The process uses an alternating process of etching and depositing a polymer on the etched walls so that there is minimal undercutting. This process enables very deep etching with little undercutting. The object is to have a deep enough etch so that the depth of wells 40 and 42 will exceed the final thickness of the cap wafer 24 after processing. The processing involves reducing the thickness of the cap wafer 24 on the non-well side by a process such as grinding or lapping and polishing to expose the wells 40 and 42. In the present example, the final thickness would be under 100 microns.

Figure 2B:
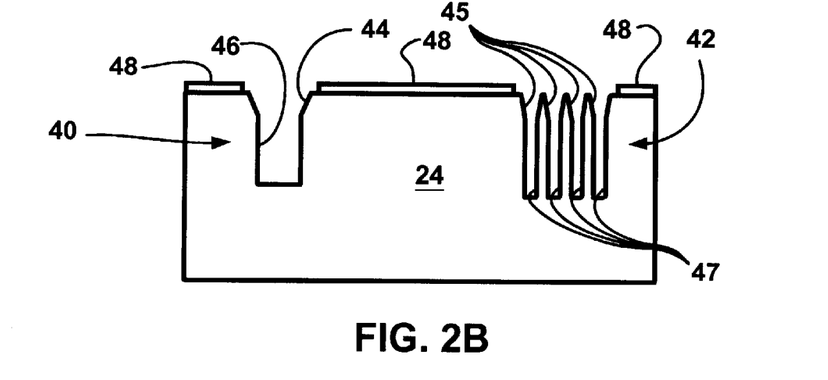

In FIG. 2B a barrier layer 48, such as an oxide layer, is deposited over the exposed surfaces of the cap wafer 24 and etched away from the wells 40 and 42 and their respective entry tapers 44 and 45. Alternatively, the barrier layer 48 can be used as a mask to form the wells 40 and 42.

Figure 2C:
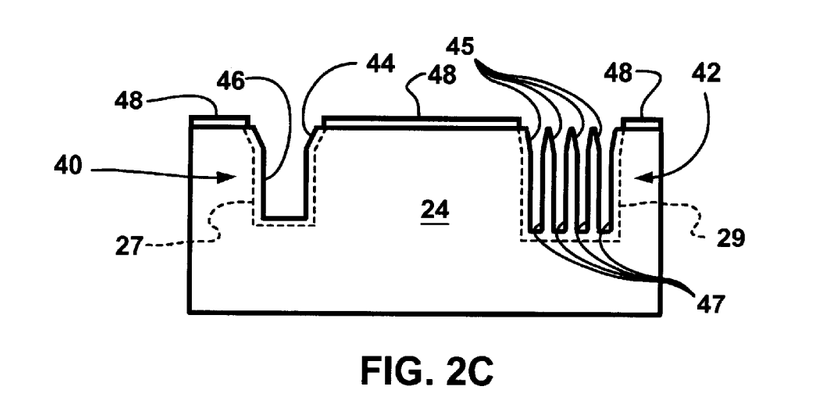

In FIG. 2C a diffusion step is performed to introduce the diffused semiconductor dopants 27 and 29, respectively, into the walls 46 and 47 of the respective wells 40 and 42. The barrier layer 48 blocks the diffusion of the semiconductor dopants 27 and 29 into the rest of the cap wafer 24. The material used for the cap wafer 24 is generally very high resistivity silicon, so a semiconductor dopant decreases the resistivity and therefore increases the conductivity of the silicon in the walls 46 and 47, respectively, of the wells 40 and 42. The semiconductor dopant diffusion may be performed from a gas-source, liquid-source, or a solid-source.

Figure 2D:
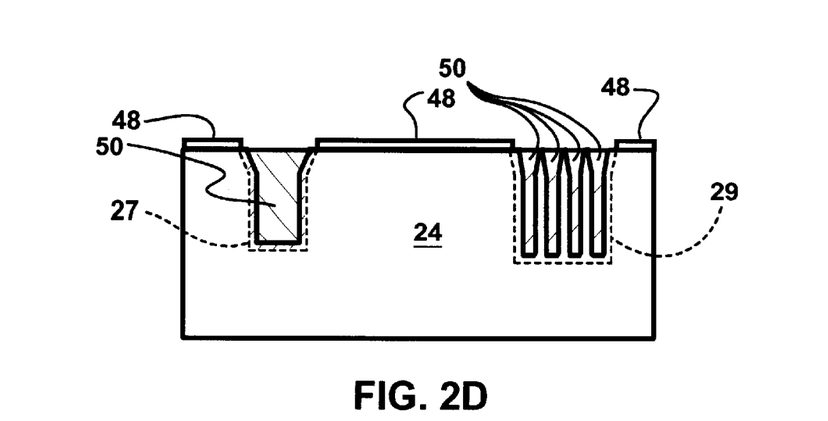

In FIG. 2D, fill material 50 is deposited to fill the wells 40 and 42. The fill material 50 could be a conductor metal, such as gold, or an insulator, such as low-temperature oxide (LTO), or a dopant-containing insulator, such as phosphosilicate glass, or a semiconductor material, such as polycrystalline silicon (polysilicon). The fill material 50 is generally deposited by a conventional semiconductor deposition process, such as chemical vapor deposition (CVD), sputtering, evaporation, electro-plating, etc. These processes make the fill material 50 integral with the walls 46 and 47. Where the fill material 50 is a conductor metal, the metal could be one of those used for making the seals such as gold, indium, aluminum, copper, silver, and alloys thereof. It should be understood that some conductor metals can be deposited directly and others may require additional processing to achieve integration. For example, aluminum can be deposited directly on silicon, while copper would require a barrier layer such as tungsten to prevent extensive diffusion into the silicon, which could short circuit the conductive vias. And, as previously described, gold would require an adhesive material to form a good bond. When the fill material 50 is deposited, it also deposits on the barrier layer 48 while filling the wells 40 and 42. After the wells 40 and 42 are filled, the excess fill material 50 can be removed from the surface of the cap wafer 24 in the same lapping process. Alternatively, the barrier layer 48 could provide an etch stop if chemical-mechanical polishing is used for the lapping.

Also in FIG. 2D while not required for conductor metal, a high temperature anneal, up to 1250 degrees Centigrade, is performed so that the semiconductor dopants 27 and 29 diffuse further into the walls 46 and 47 of the wells 40 and 42. Where the fill material 50 is a semiconductor material, such as polysilicon, the semiconductor dopants 27 and 29 will also be diffused into the semiconductor material to render it conductive and further increase the conductivity of the conductive vias 26 and 28.

Figure 2E:
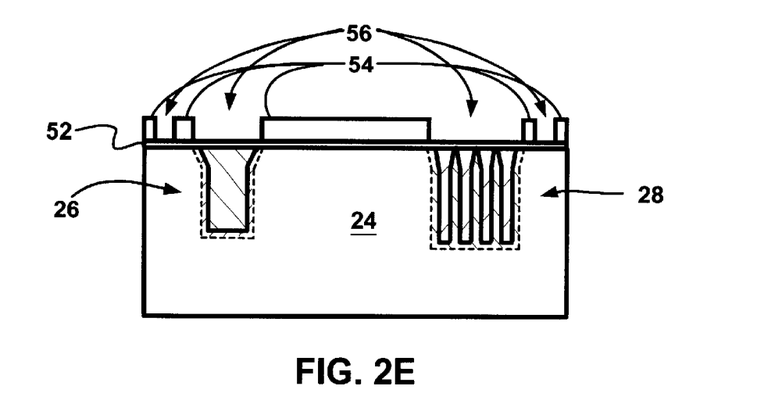

In FIG. 2E a conductive seed layer 52 is deposited through a sputtering or evaporation process over the entire well-side surface of the cap wafer 24. In the best mode, the seed layer 52 is of gold and is deposited in a sequence starting with a very thin adhesion layer (not shown) being sputtered. The adhesion layer is of a material that adheres well to the cap wafer 24 and to which the seed layer 52 also adheres well. Metals such as chromium, nickel-chromium, titanium, or an alloy thereof are used when the seed layer 52 is gold and the cap wafer 24 is silicon. The adhesion layer is used because the gold itself does not adhere well directly to silicon. Then gold is deposited on top of the adhesion layer by sputtering to a 2,000 to 3,000 angstroms (Å) thickness in the present example. Both layers, however, typically are laid down in a single sputtering or evaporation run using conventional manufacturing equipment.

A photoresist layer 54 is deposited, exposed and developed in a conventional photolithographic process to form the pattern openings 56 which define the shapes of the contacts 30 and 32 and the gasket 22. It is preferred that thick photoresist lithography be used to create the pattern for the formation of the contacts 30 and 32 and the gasket 22. Standard photoresist forms relatively thin layers so a higher viscosity, thick photoresist layer 54 is required. The thick photoresist 54 used to pattern the contacts 30 and 32 and the gasket 22 needs to be at least as thick as the final thickness the contacts 30 and 32 and the gasket 22. The photoresist layer 54 can be deposited in multiple layers so that the photoresist thickness on the surface of the cap wafer 24 is more uniform.

Figure 2F:
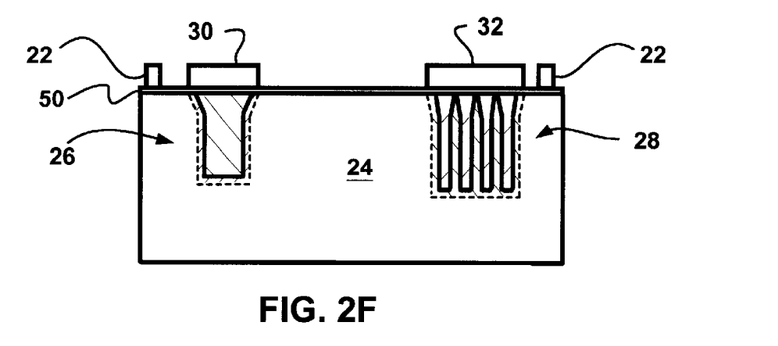

FIG. 2F shows the cap wafer 24 after it has been electroplated using the seed layer 52 as an electrode. The conductive material of the contacts 30 and 32 and the gasket 22 is deposited in the pattern openings 56 in the photoresist layer 54 on the seed layer 52. The photoresist layer 54 is removed by using a conventional photoresist stripping technique. The remaining seed layer 52 is selectively etched away by a conventional etching process. The selective etching will allow the seed layer 48 to be configured to connect to offset contacts (not shown). As the seed layer 48 is removed, the contacts 30 and 32 and the gasket 22 are reduced in height and thinned by the thickness of the seed layer 52 that is removed.

Figure 2G:
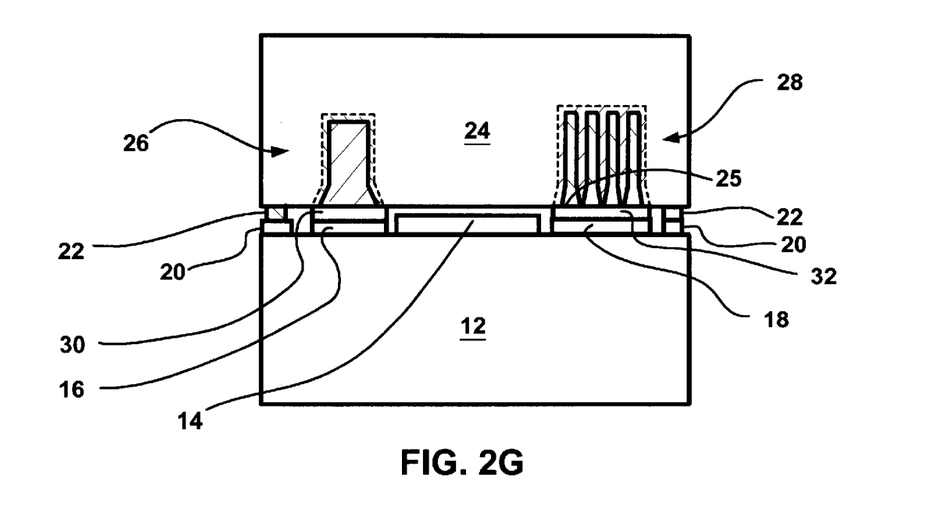

In FIG. 2G the cap wafer 24 is turned over and aligned to match the base wafer 12. The base wafer 12 is processed using conventional photolithographic processes to produce the bonding pads 16 and 18 and the peripheral pad 20. Briefly, an adhesion layer (not shown) is deposited on the base wafer 12 and a conductive material is deposited by sputtering or evaporation. Patterning is done by photolithography, the unwanted conductive material is etched away, and the photoresist is removed. Another approach is by performing the photolithography, depositing the adhesion layer and the conductive material, and then removing the photoresist and the unwanted conductive material to form the contacts 30 and 32, and the gasket 22. The base wafer 12 also has the micro device 14 associated with it, which is electrically connected to the bonding pads 16 and 18 by channels or wires (not shown).

The base wafer 12 and the cap wafer 24 are then aligned. The contacts 30 and 32 contact the bonding pads 16 and 18, respectively, on the base wafer 12 while the gasket 22 contacts the peripheral pad 20.

The base wafer 12 and the cap wafer 24 are then compressed together at temperatures up to 350 degrees Centigrade until cold weld bonding occurs. The contacts 30 and 32 weld with their respective bonding pads 16 and 18. At the same time, the gasket 22 and the peripheral pad 20 weld together. This provides the completely hermetically sealed volume 25 for the micro device 14.

Figure 2H:
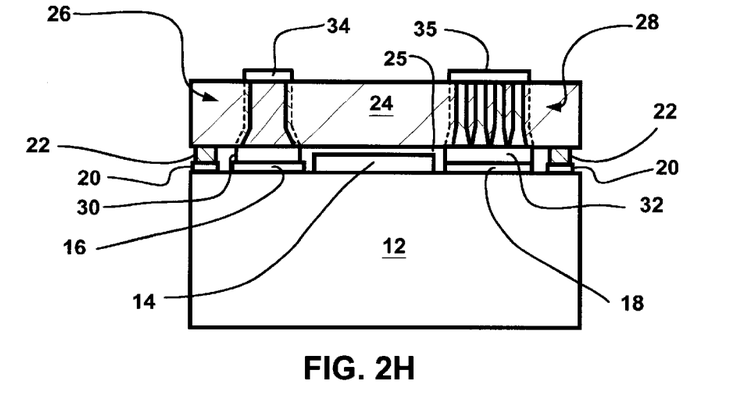

In FIG. 2H, after the hermetic sealing has been completed, the cap wafer 24 is thinned to form a "microcap" using a wafer grinding or lapping and polishing techniques until the wells 40 and 42 are opened up and the conductive vias 26 and 28 extend all the way through the cap wafer 24. Outside bonding pads 34 and 35 are then formed over and in the same configuration as the conductive vias 26 and 28. For example, the outside bonding pad 35 would be rectangular to cover the array of four conductive vias that make up the conductive via 28.

The microcap wafer-level package 10 is then ready for connection in a micro device utilizing system (not shown). Electrical contact can be made to the bonding pads 34 and 35, that are outside the hermetically sealed volume 25 on the cap wafer 24. The bonding wires 36 and 38, shown in FIG. 1A, can be bonded to the respective bonding pads 34 and 35 using conventional bonding techniques, such as ball or wedge bonding.

Figure 3A:
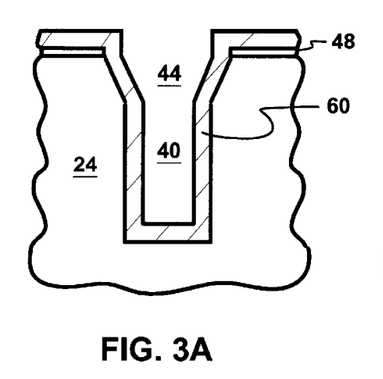
FIGS. 3A through 3C show the process steps for an alternative method of fabricating a conductive via for the microcap wafer-level package of the present invention.
Figure 3B:
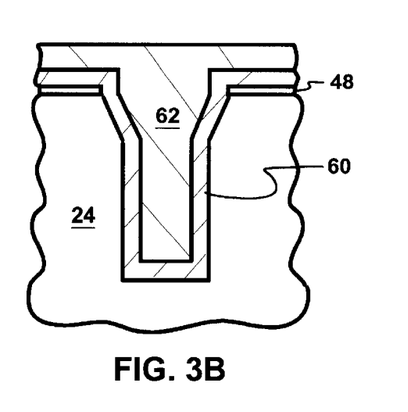
Figure 3C:
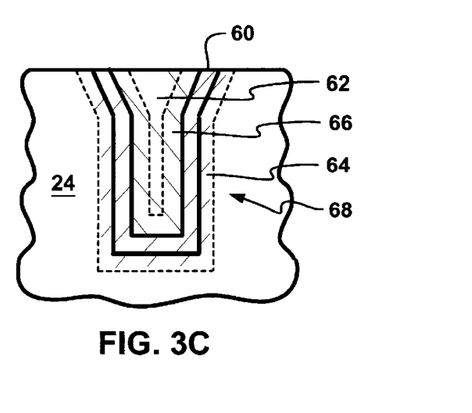

Referring now to FIGS. 3A through 3C, therein are shown the process steps in forming modified conductive vias.

In FIG. 3A, the fill material 50 shown in FIG. 2D is a dopant-containing insulator layer 60 which does not fill the well 40 (well 40 is used as a typical example and the same process would apply to the well 42). The dopant-containing insulator layer 60 is of a material such as phosphosilicate glass (PSG) or a borosilicate glass (BSG). The PSG contains an example of a Group V semiconductor doping element, phosphorous, and the BSG contains an example of a Group III semiconductor doping element, boron. The dopant-containing insulator layer 60 can be deposited in the well 40 by one of a number of conventional semiconductor deposition techniques such as low pressure chemical vapor deposition.

In FIG. 3B, a deposition of a semiconductor material 62, such as polysilicon, over the dopant-containing insulator layer 60 has filled the well 40. It should be understood that the dopant-containing insulator could be used by itself as the solid in the solid-source diffusion process, but that the conductivity will be higher when the semiconductor material 62 is used as hereinafter explained.

In FIG. 3C a high temperature anneal is performed and the semiconductor dopant from the dopant-containing insulator layer 60 is diffused into the cap wafer 24 to form the diffused dopant 64 and into the semiconductor material 62 to form the diffused dopant 66. These doped regions form the conductive via 68. The barrier layer 48, the dopant-containing insulator layer 60, and the semiconductor material 62 above the surface of the cap wafer 24 are removed.

Figure 4:
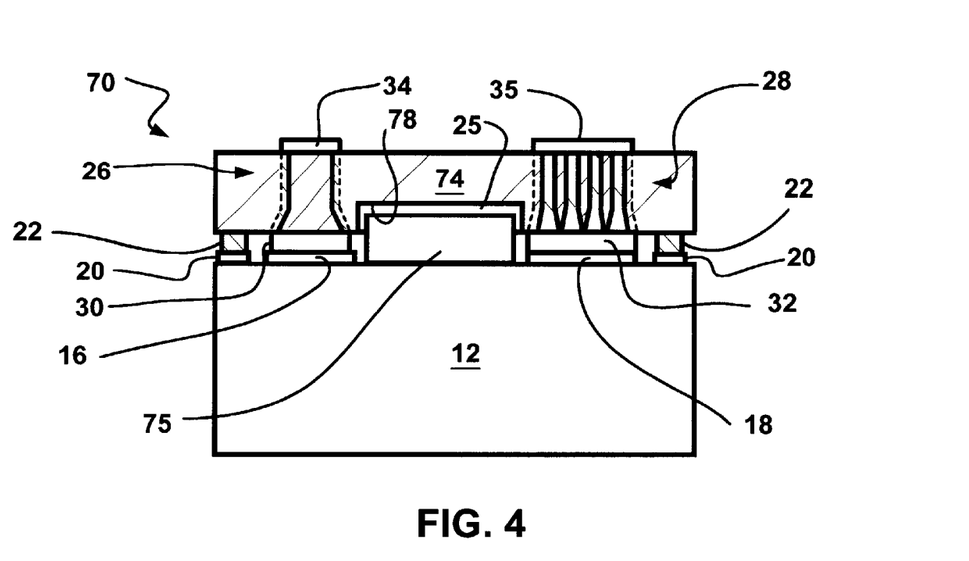
FIG. 4 shows the microcap wafer-level package of the present invention after alternative processing to accommodate a large semiconductor device.

Referring now to FIG. 4, therein is shown a microcap wafer-level package 70 where a cap wafer 74 has been etched to accommodate a relatively tall, or thick, micro device 75 on the base wafer 12. Accordingly, the gap between the cap wafer 74 and the micro device 75 can be adjusted by adding a step where the recess 78 is defined by a process such as etching in the cap wafer 74 directly above the micro device 75. The additional etching can be performed using a conventional dry etch process to accommodate micro devices that are relatively high or that need to be packaged in as small a package as possible. The thickness of the cap wafer 74 is thereby reduced near the recess 78. This also allows for the use of contacts 30 and 32 and gasket 22, that are shorter than the thickness of the micro device 75 resulting in the use of less material, such as gold, and allowing the use of a more conventional photoresist lithography process.

Figure 5:
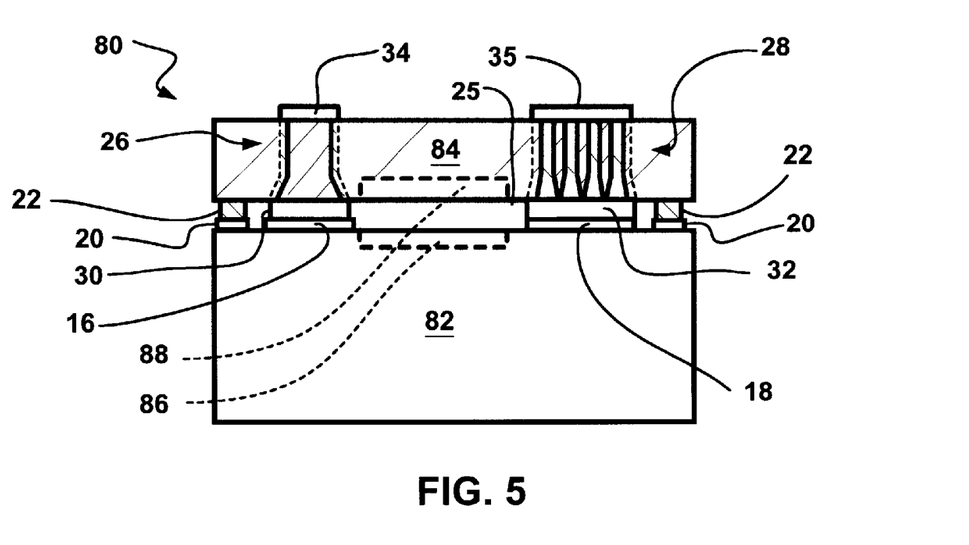
FIG. 5 shows the microcap wafer-level package of the present invention showing alternative positions for an integral integrated circuit.

Referring now to FIG. 5, therein is shown a microcap wafer-level package 80 having a base wafer 82 and a cap wafer 84. Since the wafers are silicon, they can be easily processed using conventional semiconductor manufacturing processes to form the integrated circuits 86 and 88, respectively, in the base wafer 82 and/or the cap wafer 84. Since the contacts 30 and 32 are made of a conductive material, the integrated circuit 76 is easily electrically connectable through them to the bonding pads 16 and 18 either by retaining portions of the conductive seed layers or by forming polysilicon channels on the cap wafer 84. The integrated circuit 86 in the base wafer 82 is connectable in the same manner as the micro device 14 of FIG. 1A.

It should be noted that a gap is shown between the cap wafer and the micro device. The present invention can be used to accommodate devices whether or not such a gap is necessary. For example, for some applications such as some sensors or filters, an air gap above the device is required for the device to work properly. Similarly, if a device comprises a mechanical device and moving parts that need to be free moving as in an accelerometer or pressure sensor, then a gap may be required. In the case of integrated circuit devices, for example, the gap may not be required. The distance of the gap can be controlled by a combination of how high the gaskets are plated and how much pressure is applied to combine the cap wafer 24 with the base wafer 12 by compressing the gaskets thereby avoiding the need for multi-layered gaskets.

The present invention has applicability in any situation requiring wafer-level packaging. The present invention can be used to package both active and passive devices, including but not limited to integrated circuits, filters, pressure sensors, accelerometers, different types of mechanical calorimeters, and other devices.

Although the present invention has been shown and described with respect to each microcap wafer-level package, it will be apparent to those skilled in the art that the methods described allow for wafer-level manufacturing of a plurality of microcap wafer-level packages at a time. The processes described can be implemented to all the micro devices on a given wafer. The individual packaged devices can then be cut, or diced, in a conventional manner to provide individual devices that are hermetically packaged.

Additionally, while the present invention has been described in conjunction with specific embodiments of the best mode, it is to be understood that many alternatives, modifications, and variations will be apparent to those skilled in the art in light of the foregoing description. Accordingly, it is intended to embrace all such alternatives, modifications, and variations, which fall within the scope of the present invention as, set forth in the appended claims. All matters set forth herein or shown in the accompanying drawings are to be interpreted in an illustrative and non-limiting sense.

The invention claimed is:

1. A method of manufacturing a wafer package comprising:

providing a first wafer, a second wafer, and a micro device;

forming a bonding pad and a peripheral pad on said first wafer, said peripheral pad encompassing said bonding pad;

forming a seal on said second wafer, said seal configured to match said peripheral pad;

forming a well in said second wafer;

forming a conductor in said well integral with said second wafer;

bonding said first and said second wafers together using said seal to form a hermetically sealed volume therebetween, said second wafer positionable with said conductor in conductive contact with said bonding pad, and said micro device disposed in said hermetically sealed volume and connected to said bonding pad; and removing a portion of said second wafer whereby said conductor is exposed outside said hermetically sealed volume.

2. The method of manufacturing a wafer package as claimed in claim 1 wherein forming said conductor in said well includes:

depositing said conductor therein by a semiconductor deposition process whereby said conductor is integral with the wall of said well.

3. The method of manufacturing a wafer package as claimed in claim 1 wherein forming said conductor in said well includes:

depositing a barrier layer on said second wafer around said well; and diffusing a dopant in said well.

4. The method of manufacturing a wafer package as claimed in claim 1 wherein forming said conductor in said well includes:

depositing a barrier layer on said second wafer around said well;

diffusing a dopant in said well;

depositing a semiconductor material in said well;

annealing said second wafer whereby said dopant is diffused into said cap wafer and into said semiconductor material; and removing said barrier layer.

5. The method of manufacturing a wafer package as claimed in claim 1 wherein forming said conductor in said well includes:

depositing a dopant-containing insulator in said well; and annealing said second wafer whereby dopant diffuses from said dopant-containing insulator.

6. The method of manufacturing a wafer package as claimed in claim 1 wherein forming said conductor in said well includes:

depositing a dopant-containing insulator layer in said well;

depositing a semiconductor material over said dopant-containing insulator layer in said well;

annealing said second wafer whereby dopant diffuses from said dopant-containing insulator into said cap wafer and into said semiconductor material.

7. The method of manufacturing a wafer package as claimed in claim 1 wherein forming said first and said second seals includes:

forming a seed layer on said second wafer;

photolithographically processing said seed layer to leave a seal-patterned photoresist thereon;

depositing said seals on said seed layer using said seal-patterned photoresist;

removing said seal-patterned photoresist; and selectively removing said seed layer to connect to said conductor.

8. The method of manufacturing a wafer package as claimed in claim 1 including:

depositing an outside bonding pad on said conductor exposed outside said hermetically sealed volume;

placing said wafer package in a micro device utilizing system; and bonding conductors between said wafer packaging utilizing device and said outside bonding pad.

9. The method of manufacturing a wafer package as claimed in claim 1 including:

defining a recess in one of said wafers whereby a tall micro device can be accommodated.

10. The method of manufacturing a wafer package as claimed in claim 1 including:

forming a semiconductor device in one of said wafers.

11. A method of manufacturing a wafer package comprising:

providing a base wafer, a cap wafer, and a micro device;

forming a bonding pad and a peripheral pad on said base wafer, said peripheral pad encompassing said bonding pad;

forming a well of a predetermined depth in said cap wafer in a position positionable over said bonding pad;

forming a conductor integral with said cap wafer in said well;

forming a contact and a seal on said cap wafer, said contact connected to said conductor and configured to align with said bonding pad, and said seal encompassing said contact and substantially matching said peripheral pad;

bonding said base wafer and said cap wafer together using said seal to bond to said peripheral pad to form a hermetically sealed volume therein, said cap wafer positionable with said contact bonded to said bonding pad, and one of said wafers having said micro device associated therewith disposed in said hermetically sealed volume between said seal and connected to said bonding pad; and removing a portion of said cap wafer until the thickness of said cap wafer is less than the predetermined depth of said well whereby a conductive via is formed in contact with said bonding pad on said base wafer.

12. The method of manufacturing a wafer package as claimed in claim 11 wherein forming said conductor in said well includes:

depositing a metal by a semiconductor process in said well.

13. The method of manufacturing a wafer package as claimed in claim 11 wherein forming said conductor in said well includes:

depositing a barrier layer on said cap wafer around said well;

diffusing a semiconductor dopant in said well by a process selected from a group consisting of gas-source, liquid-source, and solid-source diffusion whereby said semiconductor dopant is integral with the wall of said well; and removing said barrier layer.

14. The method of manufacturing a wafer package as claimed in claim 11 wherein forming said conductor in said well includes:

depositing a barrier layer on said cap wafer around said well;

diffusing a semiconductor dopant selected from a group consisting of Group III and Group V elements in said well by a process selected from a group consisting of gas-source, liquid-source, and solid-source diffusion whereby said semiconductor dopant is integral with the wall of said well;

depositing polysilicon in said well;

annealing said cap wafer whereby said semiconductor dopant diffuses into said cap wafer and into said polysilicon; and removing said barrier layer.

15. The method of manufacturing a wafer package as claimed in claim 11 wherein forming said conductor in said well includes:

depositing a glass containing a semiconductor dopant selected from a group consisting of Group III and Group V elements in said well; and annealing said cap wafer whereby said semiconductor dopant diffuses from said glass.

16. The method of manufacturing a wafer package as claimed in claim 11 wherein forming said conductor in said well includes:

depositing a layer of glass containing a semiconductor dopant selected from a group consisting of Group III and Group V elements in said well;

depositing a polysilicon over said layer of glass in said well;

annealing said cap wafer whereby said semiconductor dopant diffuses from said glass into said cap wafer and into said polysilicon.

17. The method of manufacturing a wafer package as claimed in claim 11 wherein:

forming said first and said second seals on said cap wafer includes:

sputtering a seed layer on said cap wafer;

photolithographically processing said seed layer to leave a seal-patterned thick photoresist thereon;

depositing said seals on said seed layer using said seal-patterned thick photoresist;

removing said seal-patterned thick photoresist; and removing said seed layer formerly under said seal-patterned thick photoresist; and forming said bonding pad and said peripheral pad on said base wafer includes:

sputtering a seed layer on said base wafer;

photolithographically processing said seed layer to leave a bonding pad and peripheral pad patterned photoresist thereon;

depositing said bonding pad and said peripheral pad on said seed layer using said bonding pad and peripheral pad patterned photoresist;

removing said bonding pad and peripheral pad patterned photoresist; and removing said seed layer formerly under said bonding pad and peripheral pad patterned thick photoresist.

18. The method of manufacturing a wafer package as claimed in claim 11 including:

depositing an outside bonding pad on said conductor exposed outside said hermetically sealed volume;

placing said wafer package in a micro device utilizing system; and bonding conductors between said wafer packaging utilizing device and said outside bonding pad.

19. The method of manufacturing a wafer package as claimed in claim 11 including:

defining a recess in said cap wafer whereby a tall micro device can be accommodated.

20. The method of manufacturing a wafer package as claimed in claim 11 including:

forming a semiconductor device in one of said wafers.

* * * * *